_(12)_ United States Patent
Song et al.

(10) Patent No.: US 6,849,802 B2
(45) Date of Patent: Feb. 1, 2005

(54) SEMICONDUCTOR CHIP, CHIP STACK PACKAGE AND MANUFACTURING METHOD

(75) Inventors: Young Hee Song, Yongin (KR); Sa Yoon Kang, Seoul (KR); Min Young Son, Suwon (KR)

(73) Assignee: Samsung Electronics Co., LTD, Kyungki-Do (KR)

( * ) Notice: Subject to any disclaimer, the term of this patent is extended or adjusted under 35 U.S.C. 154(b) by 0 days.

(21) Appl. No.: 10/357,376

(22) Filed: Feb. 4, 2003

(65) Prior Publication Data

US 2003/0146012 A1 Aug. 7, 2003

(30) Foreign Application Priority Data

Feb. 6, 2002 (KR) .......................................... 2002-6765

(51) Int. Cl.[7] .............................................. H01L 23/02
(52) U.S. Cl. ...................................... 174/52.4; 257/777
(58) Field of Search ................................ 257/777, 690, 257/730; 174/52.2, 52.4

(56) References Cited

U.S. PATENT DOCUMENTS 5,394,303 A * 2/1995 Yamaji ....................... 361/749

* cited by examiner

Primary Examiner—Hung V. Ngo
(74) Attorney, Agent, or Firm—Harness, Dickey & Pierce, P.L.C.

(57) ABSTRACT

A semiconductor chip has connection lines that are routed to the side surface from bump pads on the back surface of the chip. Such semiconductor chips are stacked on a circuit board to form a chip stack package while bumps are interposed between the bump pads of the lower chip and bonding pads of the upper chip. Further, an interconnecting member such as a conductive adhesive or a wiring board is applied to the side surfaces of the stacked chips such that the connection lines are connected to the interconnecting member. Therefore, the centrally disposed bonding pads of the chips are electrically connected to the circuit board through the bumps, the bump pad, the connection lines and the interconnecting member. The semiconductor chip may have heat dissipation part formed on the back surface. Methods of manufacturing the semiconductor chip and the chip stack package are also provided.

15 Claims, 11 Drawing Sheets

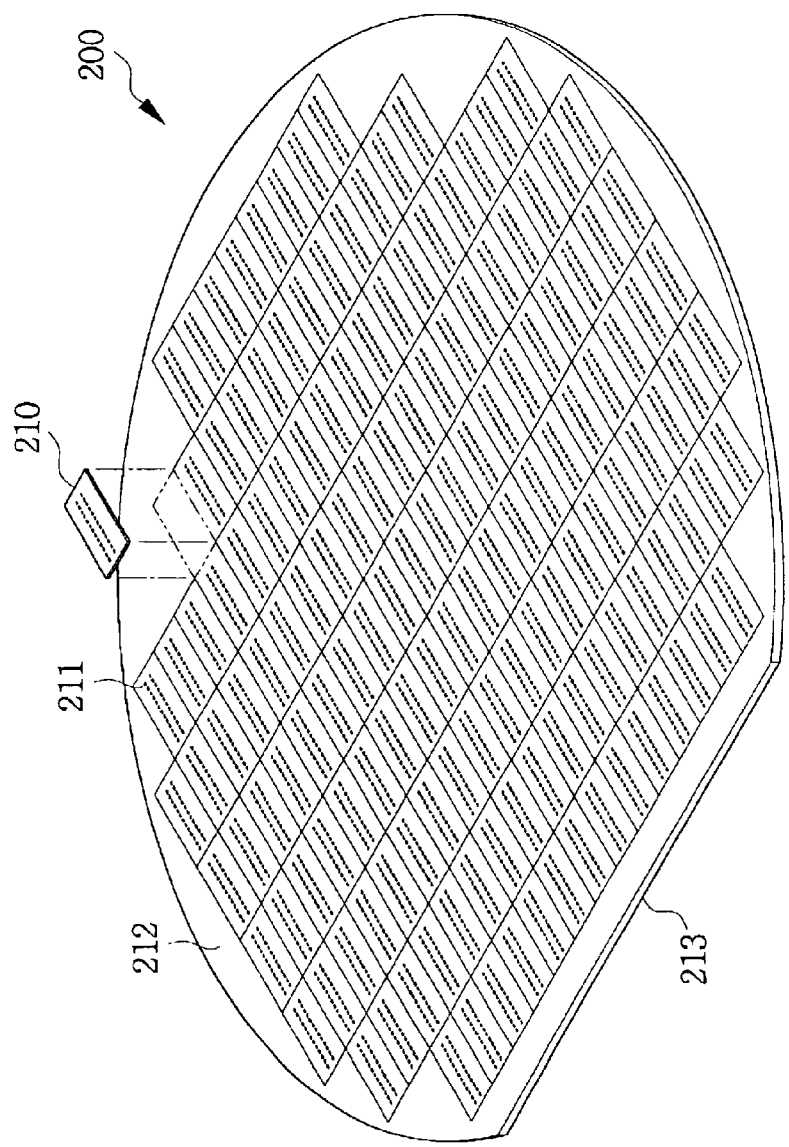

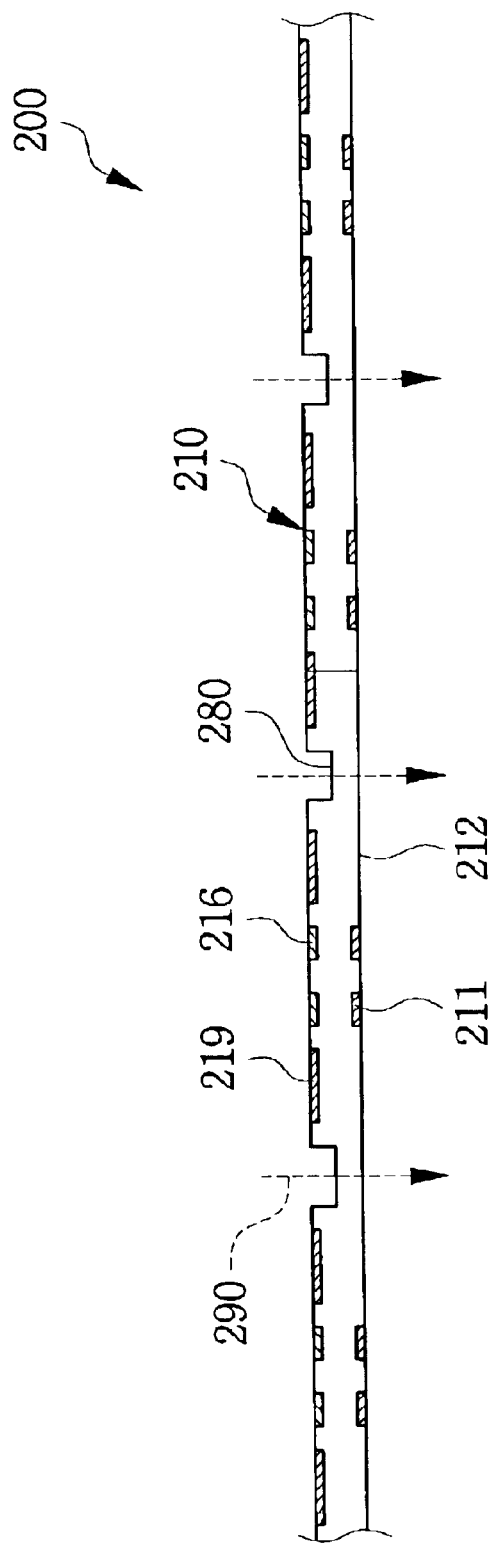

SEMICONDUCTOR CHIP, CHIP STACK PACKAGE AND MANUFACTURING METHOD

BACKGROUND

1. Field of the Invention

The present invention relates to semiconductor devices and more particularly to a semiconductor chip, a chip stack package having the semiconductor chips, and related manufacturing methods.

2. Description of Related Art

In an atmosphere of incessant pressure to reduce the size of electronic products while maintaining and increasing their functionality, extreme attention is given to every single element of an electronic assembly. Because of growing pressure to reduce size, a whole new class of IC package, especially flip chip technique and chip-scale package techniques were introduced. However, as good as these devices are at reducing the size of electronics assemblies, they too have been unable to placate the appetite of the consumer for increasing functionality of electronic products.

As a result, product engineers and designers have turned their attention to the third dimension in IC packaging. Stack techniques have emerged as an innovative means to meet the market requirements of next generation electronic products. There are variations to the stack technique such as stacking semiconductor chips or stacking packages.

The later stack package has functional diversity, since various packages are assembled, and improved reliability since the assembled elements passed functional and reliability tests. Further, this stacked package has an advantage of increased memory capacity. Since two or more packages are stacked, the size of the package increases and therefore it is very difficult to handle.

On the other hand, to solve the foregoing problem the former chip stack package has at least two semiconductor chips in a package. This stacked package has an advantage of memory capacity and functionality that can be efficiently increased. Further, the thickness of the stack device can be further reduced when compared with the above package stack device. However the larger and larger chip stacks contain multiple chips which incur cooling problems. Because the chip stack contains multiple chips, they generate more heat per unit volume, requiring greater thermal dissipation. Moreover, this dissipation must occur now through layers of semiconductor substrate material.

FIG. 1 is a sectional view showing a conventional chip stack package available from Vertical Circuit Inc., U.S.A. As shown in FIG. 1, the chip stack package 100 has a plurality of semiconductor chips 110. Each semiconductor chip 110 has an active surface 112 formed with bonding pads 111 and a backside 113 that is at the rear of the active surface 112. An insulation layer 114 covers the entire surface of the semiconductor chips 110 only exposing bonding pads 111 for conductive bumps 115. The conductive bumps 115 are attached between the bonding pads 111 of lower chips 110b, 110c, 110d, 110e, 110f and 110g and the backside 113 of respective upper semiconductor chips 10a, 110b, 110c, 110c, 110d, 110e and 110f.

A heat sink 150 is placed between each two neighboring semiconductor chips 110 for ensuring efficient heat emission from each semiconductor chip 110. The lowest semiconductor chip 110g is attached on a silicon substrate 120. The stacked chips 110 and substrate 120 are electrically interconnected by the conductive bumps 115 and a conductive adhesive 160. Lastly, for electrical connection of the chips 110 externally, the silicon substrate 120 is bonded to lead frame 130 using conventional die-attach and wire-bonding processes. Then the structure 100 is molded, formed and trimmed.

The signal path in the chip stack package 100 is from an external device to the lead frame 130, the bonding wires 140, the silicon substrate 120, the conductive adhesive 160, each conductive bump 115, and to each semiconductor chip 110a to 110g. During operation of the chips 110, heat is generated, which is emitted to the outside through the heat sink 150.

In this chip stack package 100, the interconnection of each semiconductor chip 110 and silicon substrate 120 is made by the conductive adhesive 160 instead of wires conventionally used in packaging technology. Many problems occurring due to using the wires, for example, wire sweeping at higher wire loop in molding process, increased signal path length and increased inductance are resolved by using the conductive adhesive 160. The chip stack package 100 can gain higher speed and lower noise levels by reducing the signal inductance and power/ground inductance.

However, when the chip stack package 100 includes different types of semiconductor chips 110, the conductive adhesive 160 is not easily formed due to different dimensions of the chips 110 in profile. This causes a difficulty in realizing a multi-functional stack package by using different chips. Additionally, it is hard to efficiently inject the conductive adhesive 160 into a space between neighboring semiconductor chips 110, which results in poor electrical connection with the conductive bumps 115. Therefore, the conventional chip stack package 100 cannot employ a center pad type chip in which the bonding pads are centrally disposed on the active surface, but an edge pad type chip in which the bonding pads are peripherally disposed on the active surface.

SUMMARY

Exemplary embodiments of the present invention provide a semiconductor chip which includes an active surface, a back surface obverse to the active surface, and a side surface between the active surface and the back surface. The semiconductor chip further includes a plurality of bonding pads formed on the active surface, and a plurality of bump pads formed on the back surface. Each of the bump pads corresponds to each bonding pad. The semiconductor chip still further includes a plurality of connection lines formed on the back surface. Each connection line is connected to the bump pad and extended to the side surface. The semiconductor chip may further include at least one heat dissipation part formed on the back surface.

Other exemplary embodiments of the present invention provide a chip stack package which includes a circuit board, a lower semiconductor chip, at least one upper semiconductor chip, a plurality of bumps, an interconnecting member, and a plurality of outer terminals. The circuit board has first contact pads and second contact pads. Each of the semiconductor chip has an active surface, a back surface obverse to the active surface, a side surface between the active surface and the back surface, bonding pads formed on the active surface, bump pads formed on the back surface and corresponding to the bonding pad, and connection lines formed on the back surface, connected to the bump pads and extended to the side surface. The bumps electrically and physically connect the bonding pads of the upper semiconductor chip to the bump pads of the lower semiconductor chip, and connect the bonding pads of the lower semiconductor chip to the second contact pads of the circuit board. The interconnecting member is applied to the side surfaces of both the lower and upper semiconductor chips and connected to the first contact pads of the circuit board. The outer terminals are electrically connected to the circuit board.

In the chip stack package, each semiconductor chip may further have at least one heat dissipation part formed on the back surface. Additionally, each semiconductor chip may have grooves etched on the back surface and filled with the bump pads, the connection lines, and the heat dissipation part. Optionally, each semiconductor chip has an insulation layer formed on the entire back surface or on surfaces of the grooves. The bonding pads of each semiconductor chip may be disposed along a central line of the back surface. The interconnecting member may be a conductive adhesive coated on the side surface along each vertical row of ends of the connection lines and terminated to the first contact pads, or a wiring board having conductive lines on an insulating board, the respective conductive lines being attached to ends of the connection lines at the side surface and connected to the first contact pads. The outer terminals may be metallic balls attached to the circuit board, or lead frames electrically connected to the circuit board by bonding wires.

Other exemplary embodiments of the present invention provide methods of manufacturing a semiconductor chip and a chip stack package. To manufacture the semiconductor chip, a semiconductor wafer having semiconductor chips and scribe lines is provided. Each semiconductor chip has bonding pads formed on an active surface, and each scribe line is formed between the adjacent semiconductor chips. And, grooves are formed on a back surface obverse to the active surface, and, by applying a conductive material in the grooves, bump pads and connection lines are formed. Each bump pad corresponds to each bonding pad, and each connection line is extended from the bump pad and exposed to the scribe line. Then, wafer is separated along the scribe lines into the semiconductor chips.

To manufacture the chip stack package, a lower semiconductor chip and at least one upper semiconductor chip are provided. Each semiconductor chip has bonding pads formed on an active surface, bump pads formed on a back surface obverse to the active surface and respectively corresponding to the bonding pads, and connection lines formed on the back surface and respectively extended from the bump pads to a side surface between the active surface and the back surface. Also, a circuit board having first contact pads and second contact pads is provided. By using bumps, the bonding pads of the upper semiconductor chip are bonded to the bump pads of the lower semiconductor chip, and the bonding pads of the lower semiconductor chip are bonded to the second contact pads of the circuit board. An interconnecting member is applied to the side surfaces of both the lower and upper semiconductor chips such that the interconnecting member is electrically connected to the connection lines at the side surfaces and the first contact pads of the circuit board. Outer terminals are formed such that the outer terminals are electrically connected to the circuit board.

BRIEF DESCRIPTION OF THE DRAWINGS

These and other purposes, features and advantages of the present invention will be readily understood with reference to the following detailed description thereof provided in conjunction with the accompanying drawings, wherein like reference numerals designate like structural elements, and, in which:

FIG. 2b is a cross-sectional view taken along the line IIB—IIB of FIG. 2a;

FIG. 8a to FIG. 8d are perspective views showing processes of a semiconductor chip of the present invention.

DETAILED DESCRIPTION OF THE PREFERRED EMBODIMENTS

Preferred embodiments of the present invention will be described below with reference to the accompanying drawings.

Figure 1:
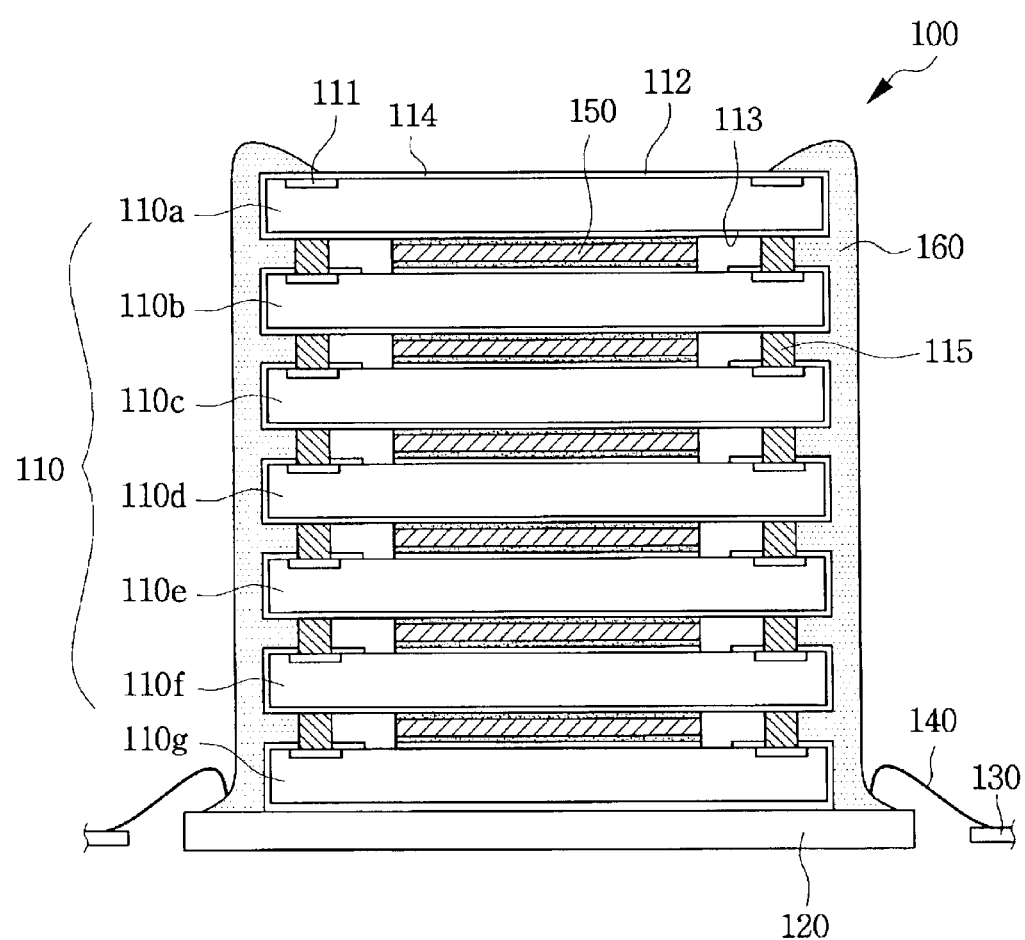
FIG. 1 is a sectional view showing a conventional chip stack package.
Figure 2A:
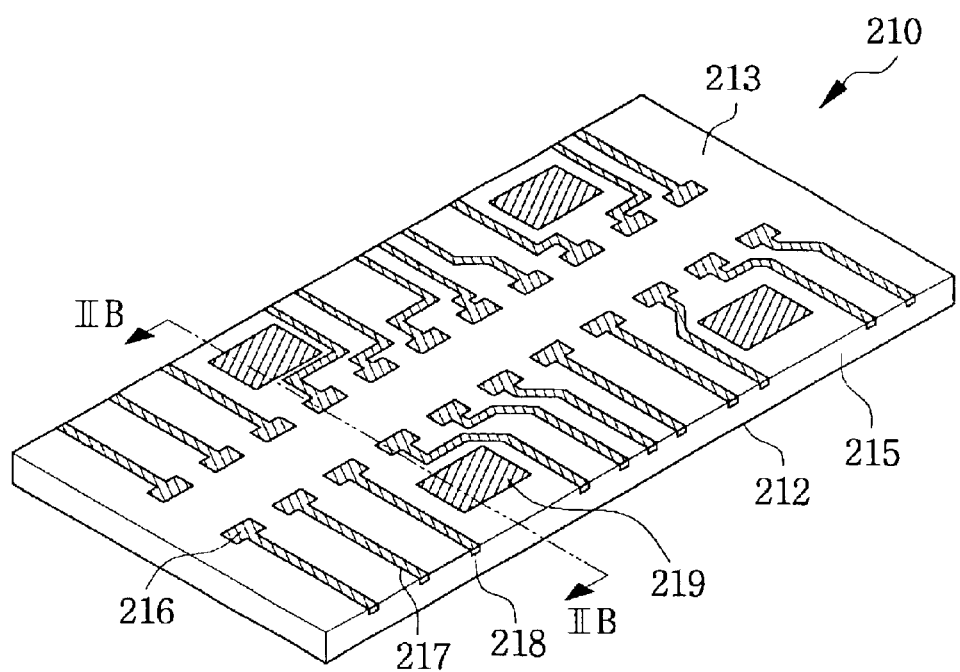
FIG. 2a is a perspective view showing a semiconductor chip according to one embodiment of the present invention.
Figure 2B:
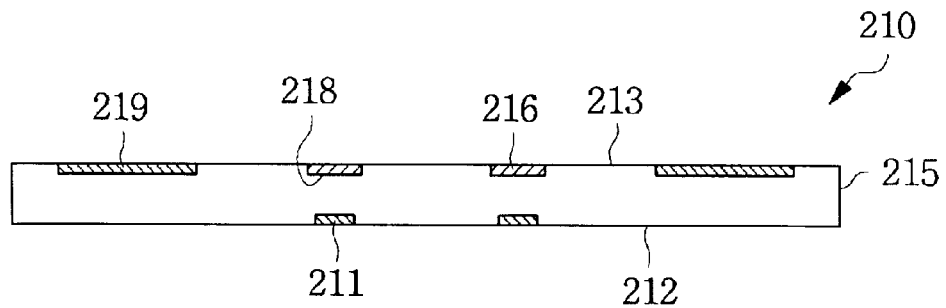

FIG. 2a is a perspective view showing a semiconductor chip 210 according to one embodiment of the present invention and FIG. 2b is a cross-sectional view taken along the line IIB—IIB of FIG. 2a. As shown in FIGS. 2a and 2b, the semiconductor chip 210 has an active surface 212 where on-chip circuits (not shown) and bonding pads 211 are formed, and a back surface 213 which is obverse to the active surface 212. The bonding pads 211 are disposed along a longer central line of the active surface 212. Therefore, the semiconductor chip 210 is a center pad type chip. The back surface 213 has bump pads 216 and connection lines 217. Each connection line 217 is connected to each bump pad 216 and extended to a side surface 215 of the semiconductor chip 210. Like the bonding pads 211, the bump pads 216 are disposed along a longer central line of the back surface 213. The bump pads 216 and the connection lines 217 are formed in grooves 218 etched on the back surface 213.

The semiconductor chip 210 further has at least one heat dissipation part 219 that is formed between the connection lines 217. The heat dissipation part 219 is formed in the groove 218 by plating high conductivity material such as metals like Cu, Ag, Au, Pt, and Al etc. Preferably, the heat dissipation part 219, the bump pads 216 and the connection lines 217 are formed at the same time. The heat produced by the semiconductor chip 210 is easily spread to the chip's outer side by the heat dissipation part 219, together with the bump pads 216 and the connection lines 217.

Figure 3A:
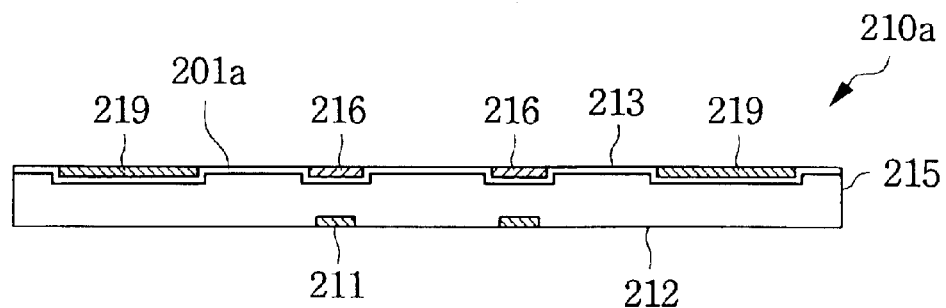
FIG. 3a is a cross-sectional view showing a semiconductor chip according to another embodiment of the present invention.
Figure 3B:
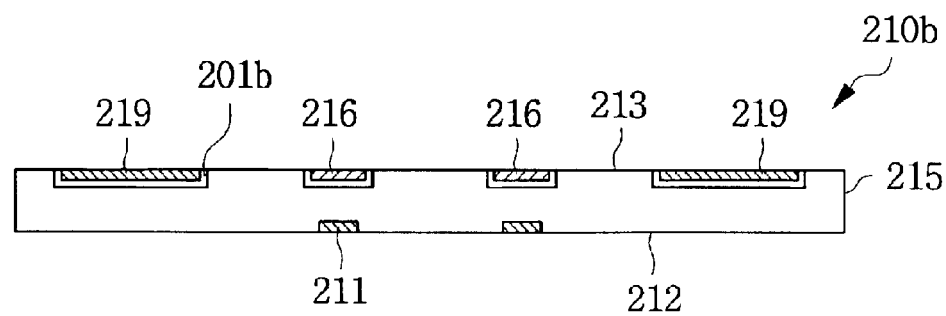
FIG. 3b is a cross-sectional view showing a semiconductor chip according to still another embodiment of the present invention.

FIG. 3a is a cross-sectional view showing a semiconductor chip 210a according to another embodiment of the present invention and FIG. 3b is a cross-sectional view showing a semiconductor chip 210b according to still another embodiment of the present invention. These Figures show embodiments having different insulation layers. The insulation layer is formed on the entire back surface 213, as shown with a layer 201a in FIG. 3a, or on surfaces of the grooves 218, as shown with a layer 201b in FIG. 3b. The insulation layer 201a or 201b is intended to reduce the signal interference and leakage between circuits on the active surface 212 and the back surface 213. Therefore, the insulation layer 201a or 201b is formed before the high conductivity material is formed in the groove 218.

Figure 4:
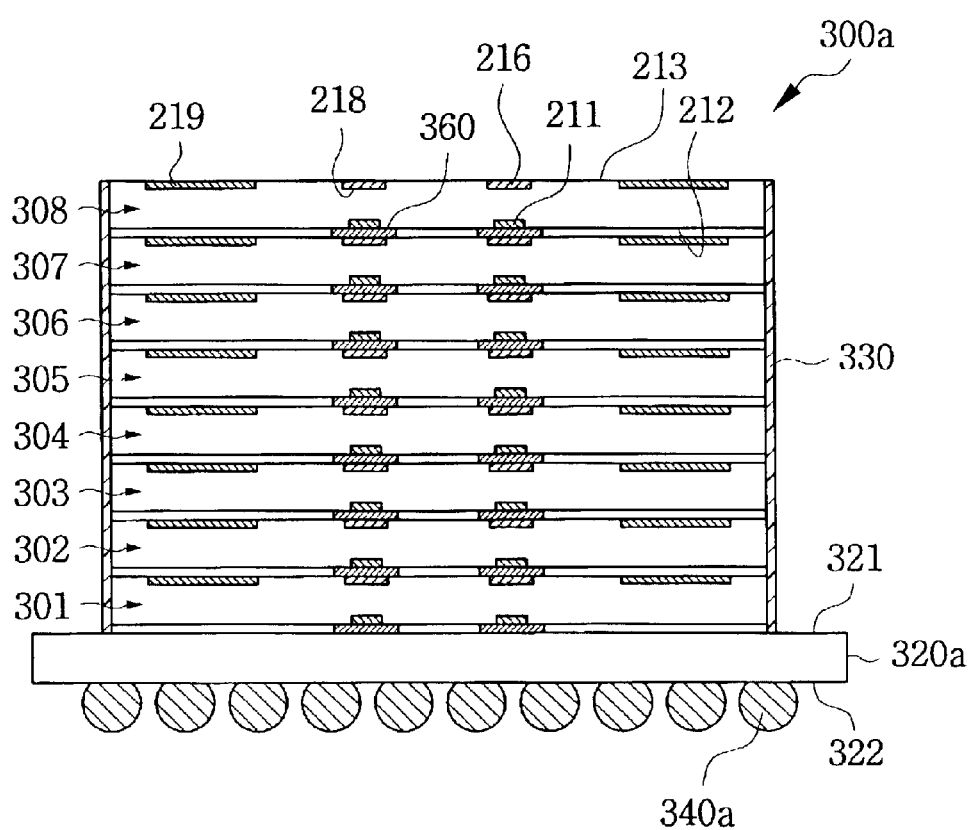
FIG. 4 is a cross-sectional view showing a chip stack package according to one embodiment of the present invention.
Figure 5:
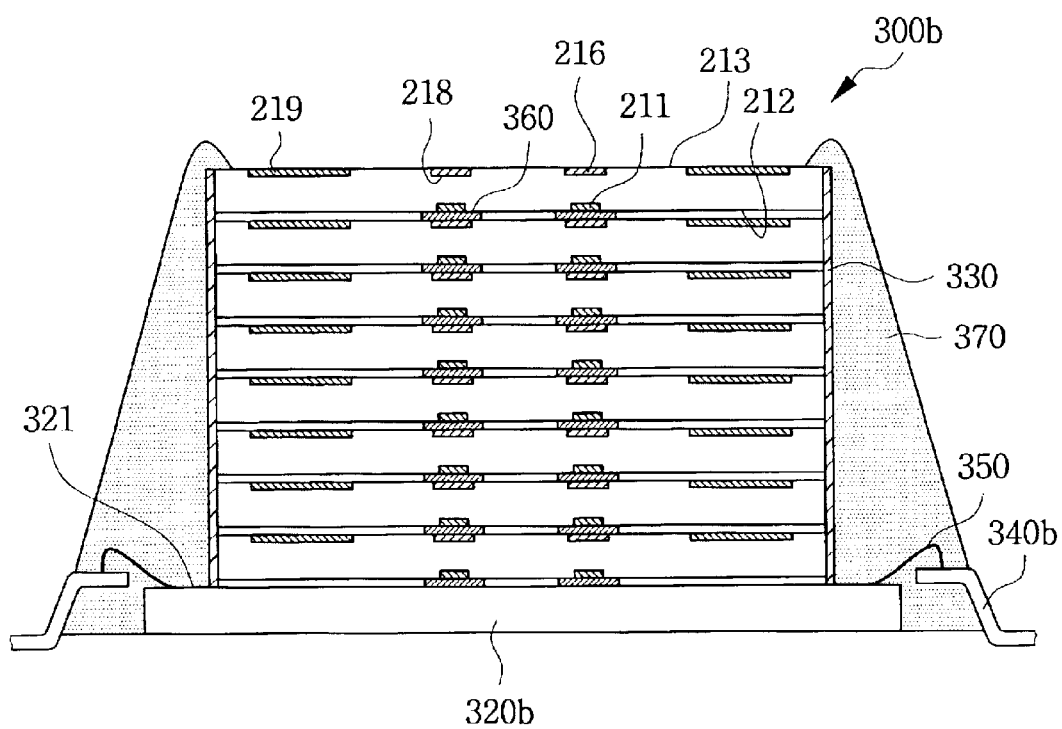
FIG. 5 is a cross-sectional view showing a chip stack package according to another embodiment of the present invention.

FIG. 4 is a cross-sectional view showing a chip stack package 300a according to one embodiment of the present invention. FIG. 5 is a cross-sectional view showing a chip stack package 300b according to another embodiment of the present invention. As shown in FIGS. 4 and 5, a chip stack package 300a or 300b has a plurality of semiconductor chips 301, 302, 303, 304, 305, 306, 307 and 308, each of which is one of three types of the semiconductor chip described above with reference to FIGS. 2b, 3a and 3b. All semiconductor chips 301 to 308 are stacked on a circuit board 320a shown in FIG. 4 or 320b shown in FIG. 5 so that each active surface 212 thereof faces toward the circuit board 320a or 320b. In particular, the bonding pad 211 of the upper semiconductor chip (for example, 305) is electrically and physically-connected to the bump pad 216 of the lower semiconductor chip (for example, 304) by a bump 360. On the other hand, the bonding pad 211 of the lowermost semiconductor chip 301 is connected to the circuit board 320a or 320b by the bump 360.

Still referring to FIGS. 4 and 5, the chip stack package 300a or 300b further has an interconnecting member 330, which is adhered to the side surfaces of the chips 301 to 308 and a top plane 321 of the circuit board 320a or 320b. Therefore, the end of the connection line 217 (not shown in FIGS. 4 and 5, but shown in FIG. 2a or FIGS. 6 and 7) is electrically and physically connected to the interconnecting member 330 at the side surface 215 of each chip 301 to 308. As a result, the bonding pads 211 of each chip (for example, 305), except the lowermost chip 301, are electrically connected in sequence to the bumps 360, the bump pads 216 of the lower chip (for example, 304), the connection lines 217 of the lower chip, the interconnecting member 330 and the circuit board 320a or 320b. More detailed descriptions about the interconnecting member 330 will be given below.

The chip stack package 300a or 300b in FIGS. 4 and 5 also has outer terminals 340a or 340b. One of differences between two embodiments in FIGS. 4 and 5 is the outer terminals. While the chip stack package 300a of FIG. 4 uses metallic balls 340a as the outer terminals, the chip stack package 300b of FIG. 5 uses lead frames 340b. Additionally, while the metallic balls 340a of FIG. 4 are directly attached to a bottom plane 322 of the circuit board 320a, the lead frames 340b of FIG. 5 are electrically connected to the top plane 321 of the circuit board 320b through bonding wires 350. Therefore, the circuit board 320a of FIG. 4 has circuitry pattern, such as contact pads of FIGS. 6 and 7, on both top and bottom plane, whereas the circuit board 320b of FIG. 5 has circuitry pattern on only top plane. Further, as illustrated in FIG. 5, the chip stack package 300b may have an encapsulation part 370, such as a resin-molded part, for protecting wire-bonded portions from hostile external environment.

Figure 6:
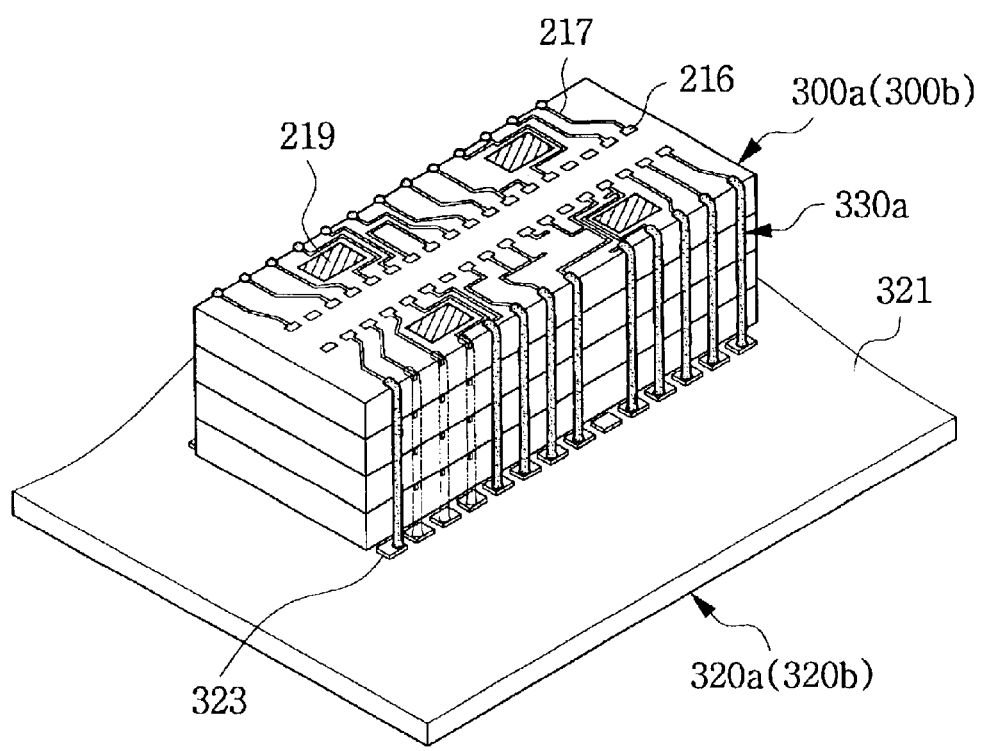
FIG. 6 is a partial perspective view showing a semi-processed chip stack package according to one embodiment of the present invention.
Figure 7:
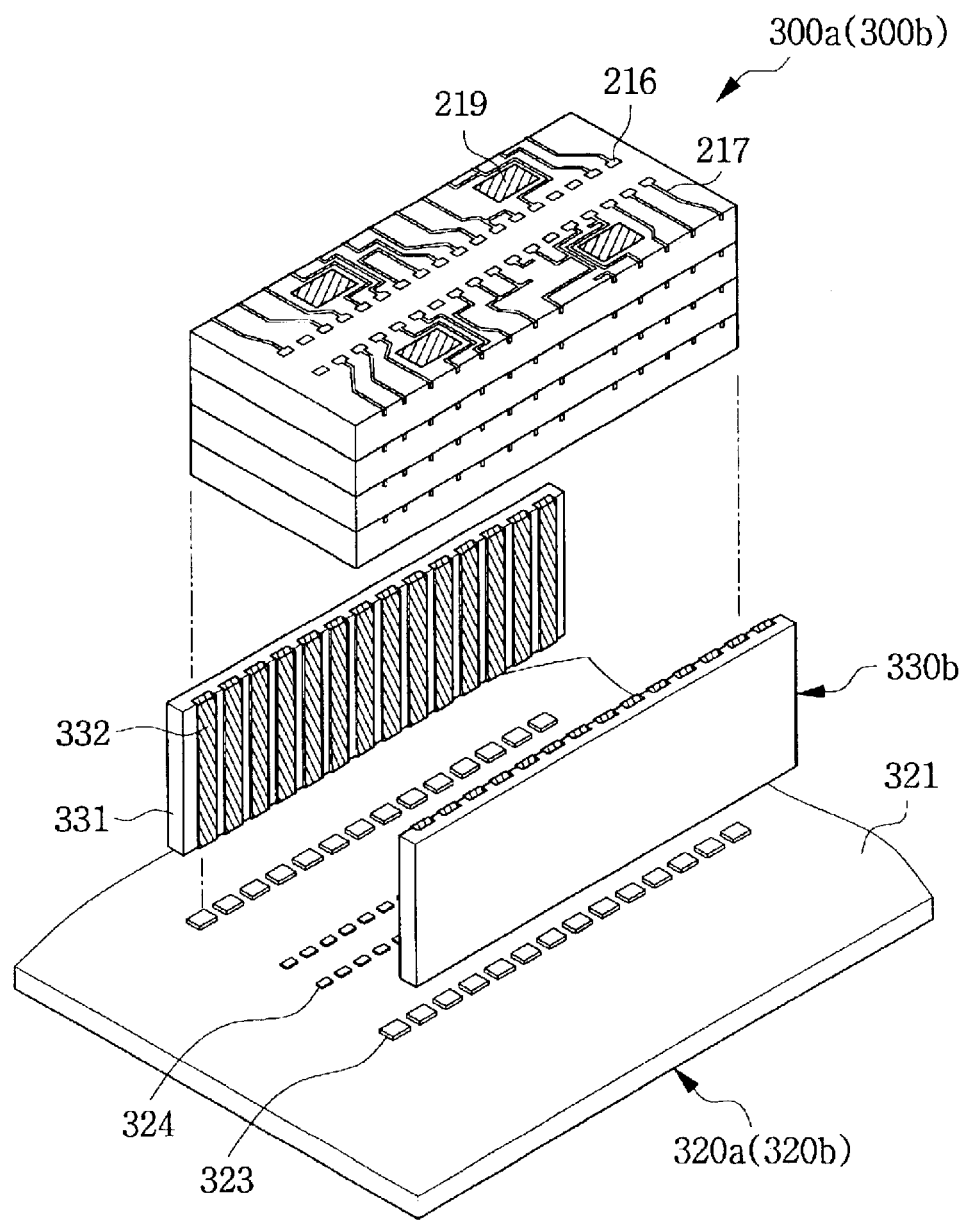
FIG. 7 is a partial perspective view showing a semi-processed chip stack package according to another embodiment of the present invention.

The above-mentioned interconnecting member 330 of the chip stack package is described below with two preferred examples. As shown in FIG. 6, conductive adhesive 330a is used as one example of the interconnecting member. In this example, the conductive adhesive 330a is coated along each vertical row of ends, exposed to the side surface of the stack of chips, of the connection lines 217, and terminated to the contact pads 323 on the top plane 321 of the circuit board 320a or 320b. The thickness of and between the conductive adhesive 330a are controlled to prevent electrical contact failure and shorts. In another example, as shown in FIG. 7, the interconnecting member is a wiring board 330b having conductive lines 332 formed on an insulating board 331. In this example, the respective conductive lines 332 are attached to the connection lines 217 and to the first contact pads 323 of the circuit board 320a or 320b. The lowest semiconductor chip is connected to the second contact pads 324 of the circuit board 320a or 320b by the above-described bumps (360 in FIGS. 4 and 5).

The present chip stack package is effective in multi-functionality and high performance because a single chip stack package can include providing different types of semiconductor chips as well as having the same types of semiconductor chips. Moreover, the present chip stack package can advantageously use center pad type semiconductor chips since the connection lines is provided between the bonding pads and the interconnecting member. Further, since the connection lines and the heat dissipation part are embedded in the chip, it is possible to reduce the entire thickness of the stack package without sacrificing the heat dissipation efficiency.

Manufacturing processes for the present semiconductor chip are described below. As shown in FIG. 8a, the multiplicity of semiconductor chips 210 are formed in a semiconductor wafer 200. The wafer 200 has the active surface 212 on which on-chip circuits and a plurality of bonding pads 211 are formed, and the back surface 213, obverse to the active surface 212. Preferably, the back surface 213 of the wafer 200 is ground to reduce the thickness of the resultant semiconductor chip 210.

Figure 8B:
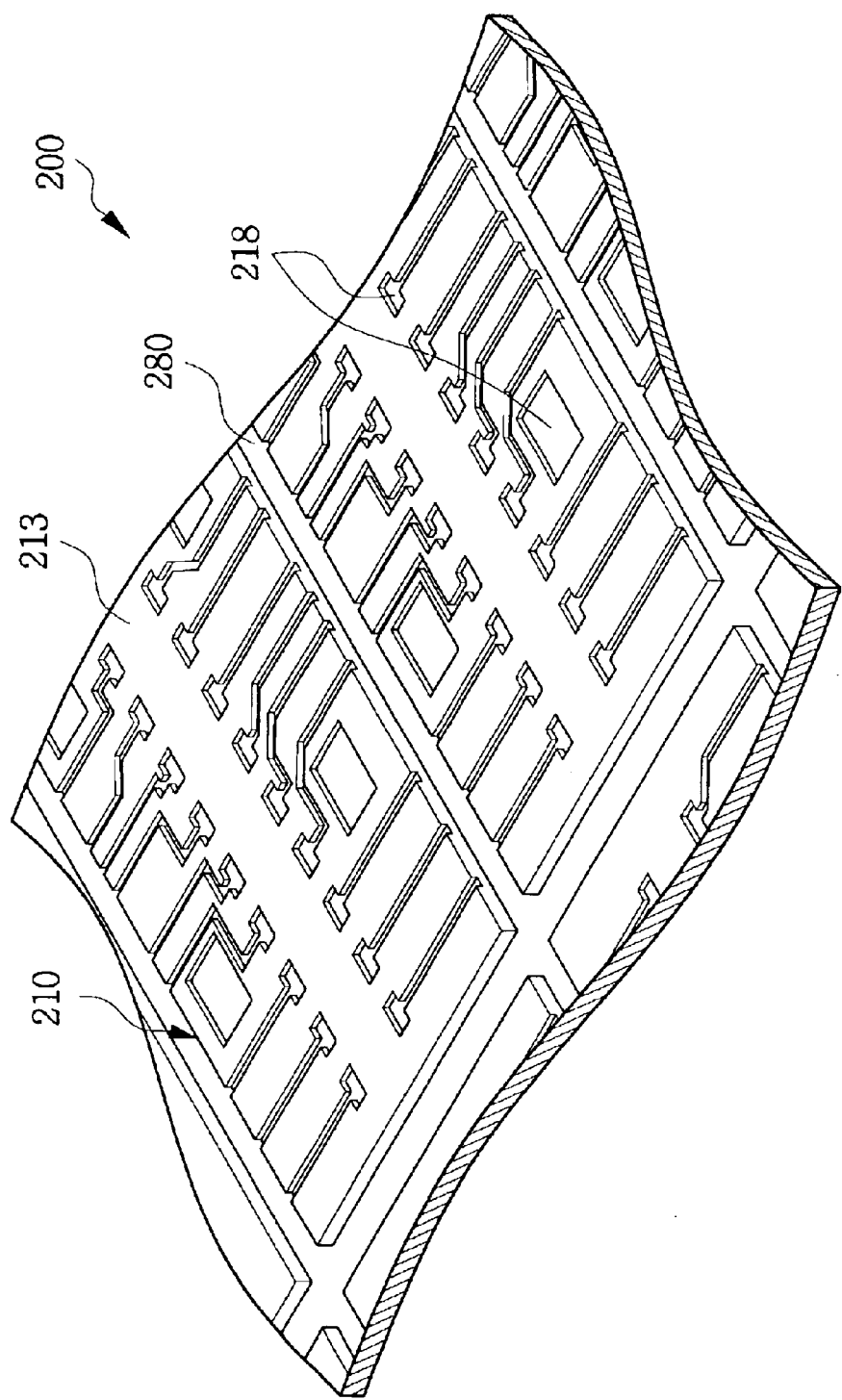

As shown in FIG. 8b, the grooves 218 are formed on the back surface 213 of the wafer 200. The grooves 218 can be made using the etching processes such as plasma etching or chemical etching. Additionally, an insulation layer (201a of FIG. 3a or 201b of FIG. 3b) can be formed on the entire back surface 213 or only on the grooves 218. The insulation layer is formed of silicon nitride or silicon oxide by the sputtering method, the chemical vapor deposition method or the thermal oxidation method, etc. A scribe line 280 is formed between the individual semiconductor chips 210. Preferably, the depth of the scribe line 280 is greater than that of the grooves 218. And, the width of the scribe line 280 is almost equal to that of a cutting tool used when scribing the wafer 200.

Figure 8C:
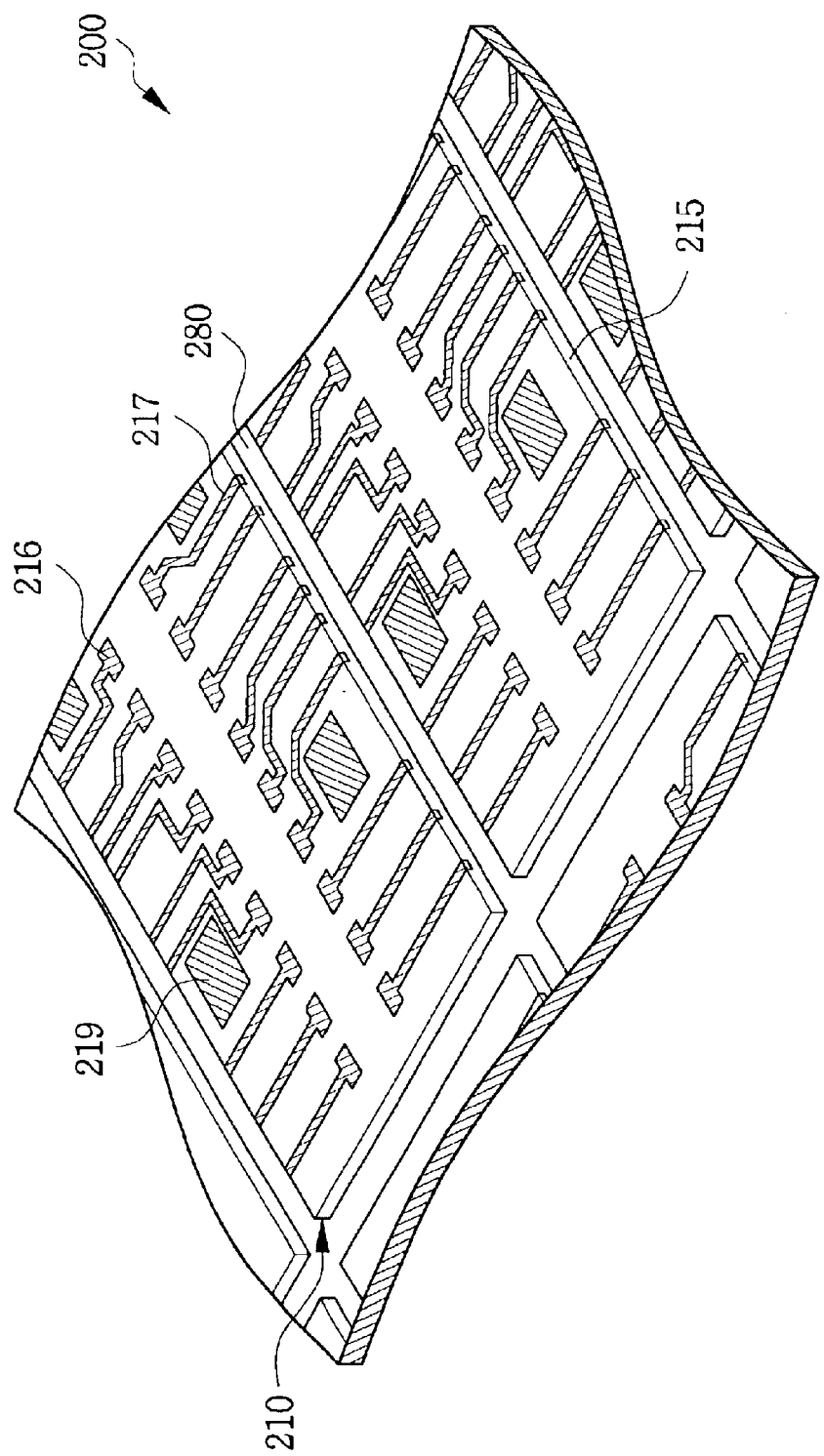

As shown in FIG. 8c, conductive material is filled in the grooves 218 to form the bump pads 216, the connection lines 217 and the heat dissipation parts 219 by the sputtering method, the plating method or the chemical vapor deposition method, etc. The connection lines 217 are extended to the side surface 215 of the chip 210 and exposed to the scribe line 280.

As shown in FIG. 8d, the wafer 200 is scribed into the plurality of semiconductor chips 210. The cutting tool 290 such as a blade or the laser separates the wafer 200 following the scribe line 280 into the individual semiconductor chips 210.

The manufacturing method for the chip stack package using this semiconductor chip is described below, for example, with reference to FIG. 4. Two semiconductor chips, for example, 304 and 305 are stacked and bonded to each other. The bonding of two chips 304 and 305 is made by the bump 360 interposed therebetween. The bump 360 is formed on the bonding pad 211 of the upper semiconductor chip 305 and/or the bump pad 216 of the lower semiconductor chip 304. On the other hand, the bonding pads 211 of the lowest chip 301 are connected to the circuit board 320a by the bump 360.

The interconnecting member 330 is connected to the connection line of the chip 210 and to the contact pad of the board 320a. When the conductive adhesive 330a of FIG. 6 is used as the interconnecting member 330, the conductive adhesive 330a is applied on the side surface of the chip stack along the respective rows of the connection lines 217, and to the contact pads 323 on the top plane 321 of the board 320a. When the wiring board 330b of FIG. 7 is alternatively used, the conductive pattern 332 of the wiring board 330b is connected to the connection lines 217 of the chip stack and to the second contact pads 324 of the board 320a by metallic bumps or conductive adhesive.

The outer terminals are connected to the circuit board. For example, as shown in FIG. 4, in case of using the metallic balls 340a such as solder balls as the outer terminals, the balls 340a are attached on the bottom plane 322 of the board 320a using reflow processes. In another embodiment, as shown in FIG. 5, the lead frame 340b is used as the outer terminals, and the bonding wires 350 connect the lead frame 340b and the board 320b. The wire-bonded portions are then encapsulated by, for example, resin encapsulant 370.

Although the present invention has been described in detail herein above with respect to the preferred embodiments thereof, many variations and/or modifications thereof will be apparent to those of ordinary skill in the art. Therefore, all such variations and modifications are seen to fall within the true spirit and scope of the present invention as defined by the appended claims.

What is claimed is:

1. A semiconductor chip comprising:
   an active surface;
   a back surface obverse to the active surface;
   a side surface between the active surface and the back surface;
   a plurality of bonding pads formed on the active surface;
   a plurality of bump pads formed on the back surface, each bump pad corresponding to at least one of the plurality of bonding pads; and
   a plurality of connection lines formed on the back surface, each connection line being connected to a corresponding one of the bump pads and extended to the side surface and having an exposed surface on the side surface.

2. The semiconductor chip of claim 1, further comprising:
   at least one heat dissipation part formed on the back surface.

3. A chip stack package comprising:
   a circuit board having first contact pads and second contact pads;
   a lower semiconductor chip having an active surface, a back surface obverse to the active surface, a side surface between the active surface and the back surface, a plurality of bonding pads formed on the active surface, a plurality of bump pads formed on the back surface and corresponding to the bonding pad, and a plurality of connection lines formed on the back surface, each connection line being connected to the bump pad and extended to the side surface;
   at least one upper semiconductor chip having an active surface, a back surface obverse to the active surface, a side surface between the active surface and the back surface, a plurality of bonding pads formed on the active surface, a plurality of bump pads formed on the back surface and respectively corresponding to the bonding pads, and a plurality of connection lines formed on the back surface, each connection line being connected to the bump pad and extended to the side surface;
   a plurality of bumps electrically and physically connecting the bonding pads of the upper semiconductor chip to the bump pads of the lower semiconductor chip, and connecting the bonding pads of the lower semiconductor chip to the second contact pads of the circuit board;
   an interconnecting member applied to the side surfaces of both the lower semiconductor chip and the upper semiconductor chip, and connected to the first contact pads of the circuit board; and
   a plurality of outer terminals electrically connected to the circuit board.

4. The chip stack package of claim 3, wherein each semiconductor chip further has at least one heat dissipation part formed on the back surface.

5. The chip stack package of claim 3, wherein each semiconductor chip further has a plurality of grooves etched on the back surface and filled with the bump pads and the connection lines.

6. The chip stack package of claim 4, wherein each semiconductor chip further has at least one groove etched on the back surface and filled with the heat dissipation part.

7. The chip stack package of claim 3, wherein each semiconductor chip further has an insulation layer formed on the entire back surface.

8. The chip stack package of claim 5, wherein each semiconductor chip further has an insulation layer formed on surfaces of the grooves.

9. The chip stack package of claim 3, wherein the bonding pads of each semiconductor chip are disposed along a central line of the back surface.

10. The chip stack package of claim 3, wherein the interconnecting member is a conductive adhesive coated on the side surface along each vertical row of ends of the connection lines and terminated to the first contact pads.

11. The chip stack package of claim 3, wherein the interconnecting member is a wiring board having conductive lines on an insulating board, the respective conductive lines being attached to ends of the connection lines at the side surface and connected to the first contact pads.

12. The chip stack package of claim 3, wherein the outer terminals are metallic balls attached to the circuit board.

13. The chip stack package of claim 3, wherein the outer terminals are lead frames electrically connected to the circuit board by bonding wires.

14. A semiconductor chip comprising:
   an active surface;
   a back surface obverse to the active surface;
   a side surface between the active surface and the back surface;
   a plurality of bonding pads formed on the active surface;
   a plurality of bump pads formed on the back surface, each bump pad corresponding to at least one of the plurality of bonding pads; and
   a plurality of connection lines formed on the back surface, each connection line being connected to a corresponding one of the bump pads and extended to the side surface and having an exposed surface on the side surface to provide a connection region on the side surface.

15. The semiconductor chip of claim 14, further comprising:
   at least one heat dissipation part formed on the back surface.

* * * * *